(12) United States Patent  (10) Patent No.: US 8,686,640 B2
Vella  (45) Date of Patent: Apr. 1, 2014

(54) MAGNETIC FIELD REDUCTION APPARATUS AND MAGNETIC PLASMA FLOOD SYSTEM FOR ION BEAM PROCESSING

(71) Applicant: E/G Electro-Graph Inc., Carlsbad, CA (US)

(72) Inventor: Michael Vella, San Leandro, CA (US)

(73) Assignee: E/G Electro-Graph Inc., Carlsbad, CA (US)

( * ) Notice: Subject to any disclaimer, the term of this patent is extended or adjusted under 35 U.S.C. 154(b) by 0 days.

(21) Appl. No.: 13/672,871

(22) Filed: Nov. 9, 2012

(65) Prior Publication Data

US 2013/0113378 A1  May 9, 2013

Related U.S. Application Data

(60) Provisional application No. 61/557,686, filed on Nov. 9, 2011.

(51) Int. Cl.
*H05H 1/50*  (2006.01)
(52) U.S. Cl.
USPC ................................ 315/111.51; 315/111.81
(58) Field of Classification Search
USPC ............. 315/111.21, 111.51, 111.71, 111.81
See application file for complete search history.

(56) References Cited

U.S. PATENT DOCUMENTS

| | | |
|---|---|---|
| 5,021,702 A | 6/1991 | Miyoshi et al. |
| 5,399,871 A | 3/1995 | Ito et al. |
| 5,545,257 A | 8/1996 | Vella |
| 6,100,536 A | 8/2000 | Ito et al. |
| 6,271,529 B1 | 8/2001 | Farley et al. |
| 6,297,594 B1 | 10/2001 | Sakai et al. |
| 2004/0020770 A1* | 2/2004 | Wang et al. .............. 204/298.18 |

FOREIGN PATENT DOCUMENTS

KR  100582787 B1  5/2006

OTHER PUBLICATIONS

Ito, H., et al., "High Density Plasma Flood System for Wafer Charge Neutralization", International Conference on Ion Implantation Technology Proceedings, 1998, pp. 478-481, Kyoto, Japan; URL: www.egraph.com/briefs/xr_amj_/xramj.pdfShare.

* cited by examiner

*Primary Examiner* — Don Le
(74) *Attorney, Agent, or Firm* — Laurence A. Greenberg; Werner H. Stemer; Ralph E. Locher

(57) ABSTRACT

An ion beam processing system includes a plasma generator with a magnetic flood system. Magnets are provided for reducing the transverse magnetic field in the ion beam transport region of the plasma flood device so as to control charging damage or to neutralize beam space charge in ion beam processing and semiconductor ion implantation. The system is especially adapted for beam lines with ribbon beams.

9 Claims, 8 Drawing Sheets

FIG. 3C
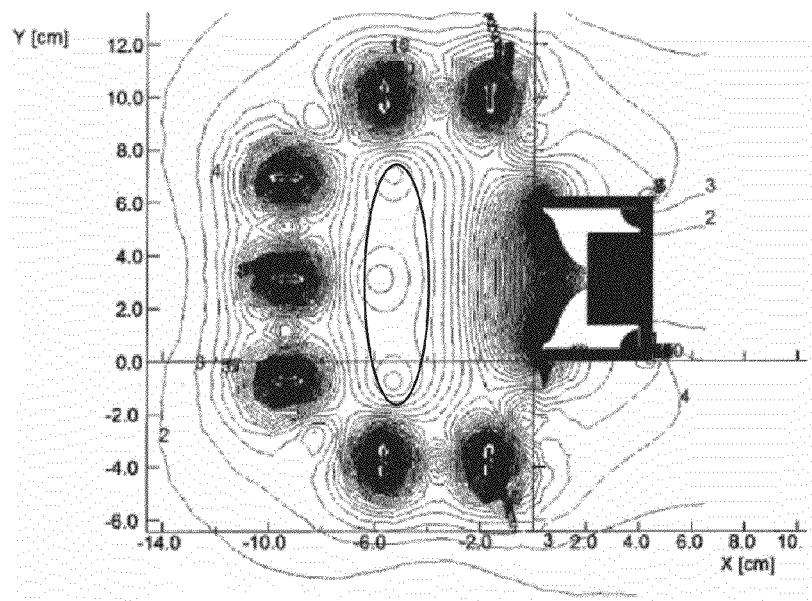
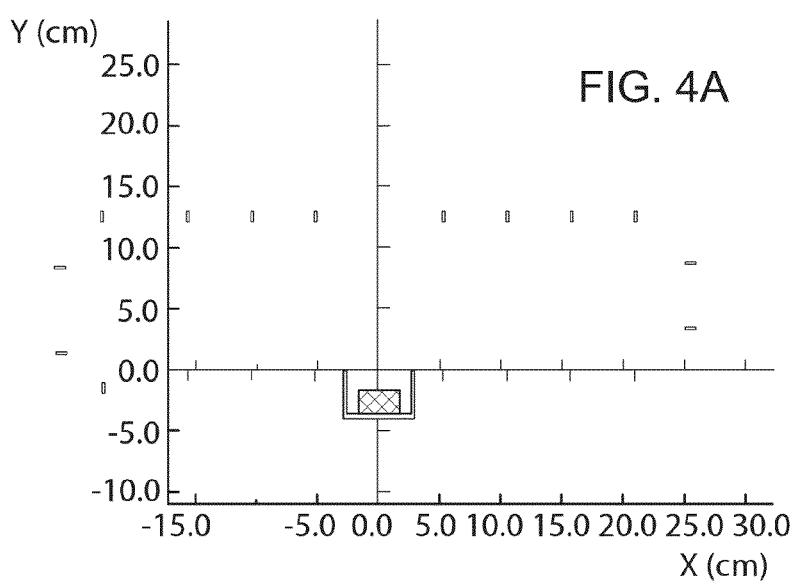
FIG. 4A

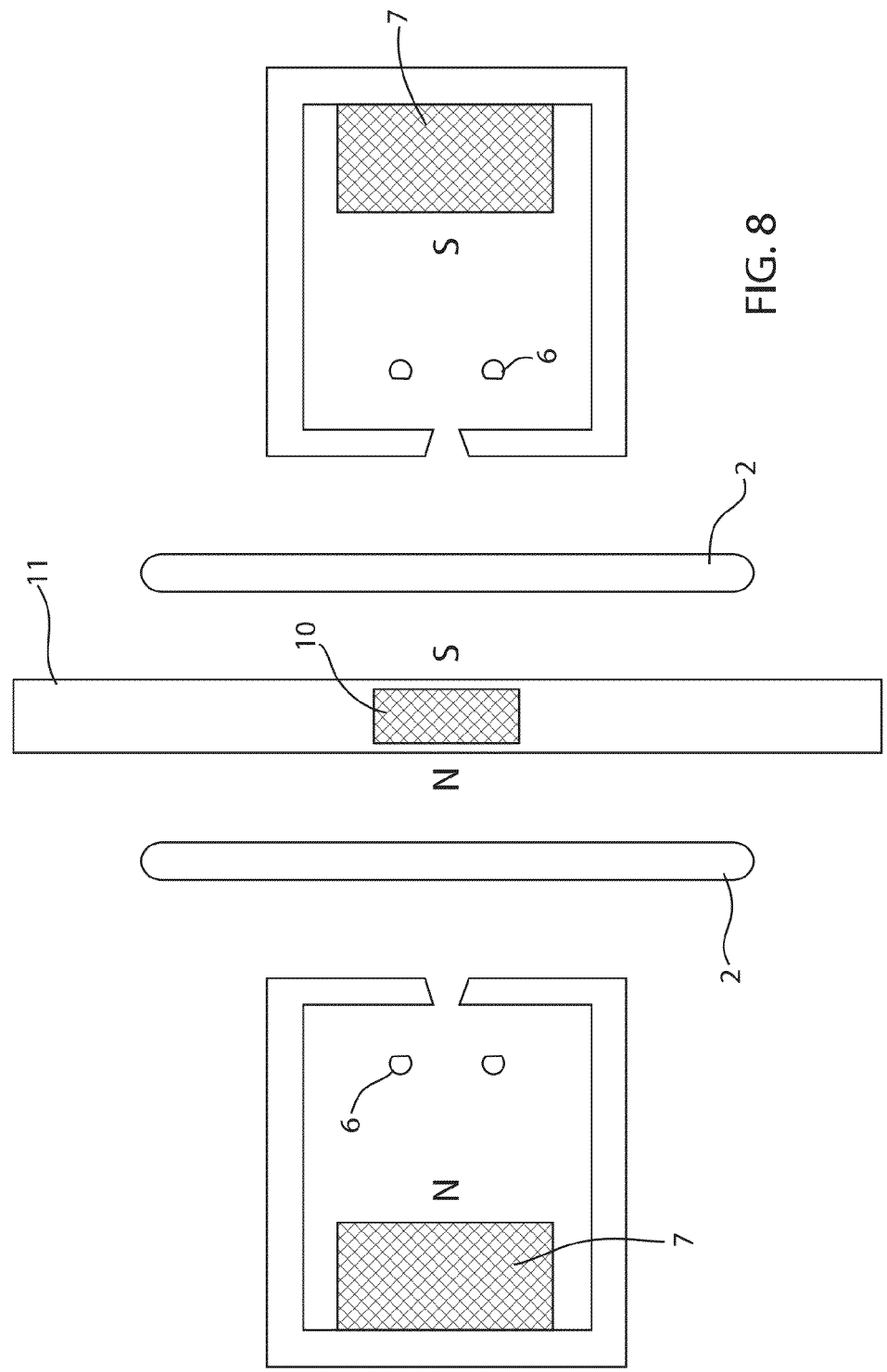

MAGNETIC FIELD REDUCTION APPARATUS AND MAGNETIC PLASMA FLOOD SYSTEM FOR ION BEAM PROCESSING

CROSS-REFERENCE TO RELATED APPLICATION

This application claims the benefit, under 35 U.S.C. §119(e), of provisional patent application No. 61/557,686, filed Nov. 9, 2011; the prior application is incorporated by reference.

BACKGROUND OF THE INVENTION

Field of the Invention

The present invention relates to ion beam implantation and ion beam processing, and more particularly to a plasma flood apparatus for dispersing plasma into an ion beam with minimal magnetic perturbation of the ion beam.

Ion implantation is routinely used in semiconductor manufacturing to add dopant atoms to a semiconductor wafer, and for various kinds of materials modification, such as sputtering of a process surface or amorphization of a crystal lattice. Plasma flood devices are often used on semiconductor ion implantation beamlines. They were originally developed as a replacement for electron flood systems, used to introduce electrons into the ion beam transport regions. Flood electrons serve to minimize positive charging damage caused by the ion beam at the process surface. Flood electrons can also serve to neutralize ion beam space charge, thereby reducing beam divergence. However, electron flood systems were sometimes found to cause negative charging damage. Plasma floods proved more effective at reducing both positive and negative charging damage. The use of a magnetic filter was developed to minimize negative charging damage associated with the primary electrons used to generate the flood plasma itself.

Reference is made, for example, to my earlier disclosure in U.S. Pat. No. 5,545,257 issued on Aug. 13, 1996, and entitled Magnetic Filter Apparatus and Method for Generating Cold Plasma in Semiconductor Processing, and also to the article by Hiro Ito, et al.; "High Density Plasma Flood System for Wafer Charge Neutralization", 1998 International Conference on Ion Implantation Technology Proceedings, Kyoto, Japan, NJ-IEEE 1999, pp. 478-481.

Compared with electron floods, an additional benefit of plasma flood systems is a greater degree of beam charge neutralization, especially if the plasma ion density equals or exceeds the ion beam particle density. A completely unneutralized ion beam would have a high divergence, because like charges repel. This is called space charge divergence. Except in the presence of a strong electric field, for example, in an acceleration gap, most ion beams become partially neutralized. The high positive electric potential associated with an ion beam attracts electrons from local ground conductors, and energetically traps free electrons. Moreover, many ion beams have sufficient energy to ionize background gas, and the beam potential traps product electrons, while expelling product ions. Beam space charge neutralization associated with these combined processes is often called background neutralization, which can be significant, but usually less than 100%.

In recent years, low energy ion beams, with energies below 10 keV, have become important for processing in beamline implant tools. In general, the cross sections for beam ionization of background gas drop significantly at low energy. That is, low energy beams generate relatively few free electrons by ionization of background gas. This makes the space charge neutralization function of plasma floods especially important for low energy beamline implantation, even if control of positive charging damage is not required for that specific process. However, the magnetic filter effect is still required to ensure that energetic flood electrons are inhibited from reached the beam target and causing negative charging damage.

Plasma floods are typically powered by d.c. electrical arc. The present disclosure, therefore, focuses on arc-based floods. However, the effect of magnetic fields on free electrons also applies to RF-powered plasmas, or, to microwave power, with some complication due to possible electron cyclotron resonance and plasma cutoff.

The simplest kind of plasma ion source uses no applied magnetic field, and is sometimes called magnetic field-free. For example, a field-free arc has only a chamber, an anode, which may be the chamber itself, a gas source and a cathode. Some commercial plasma flood systems use a magnetic field-free plasma source design. Reference is made to an article by Wan, et al., "Water Cooled Flood Source for Intense Ion Beam Implantation" in Proc. $14^{th}$ Int. Conf. on Ion Implantation Tech., Taos, N.M., U.S.A., edited by B. Brown et al., pp 432-435. Field-free ion sources have the advantage of simplicity, but offer limited opportunity for performance optimization.

Magnetic fields are routinely used in plasma sources to improve specific performance characteristics, such as power efficiency, gas efficiency, ion species, or, source life.

Commercial plasma floods based on the principles described in my earlier U.S. Pat. No. 5,545,257 have been available for years. They are sometimes referred to as a High Density Plasma Flood System (HD PFS) and this expression will be retained in this description. A highly diagrammatic top view cross sectional drawing of HD PFS is shown in FIG. 1. Here, the ion species issues from an ion beam generator 1 along an ion beam 2. The various elements of the ion beam generator 1, namely, the ion source, the analyzer, acceleration system, focusing system, and the like, are not illustrated for simplicity. It is only important that the ion beam 2 has been previously generated. The HD PFS is mounted on the beamline guide tube 3, ahead of the process target 4. The flood plasma is generated in an arc chamber 9, using a cathode filament 6 that has been shaped and located in the magnetic field from source magnet 7. The filament, source magnet, and magnetic yoke 8 are designed to achieve a magnetic filter effect, where primary electrons from the filament must cross magnetic field before being free to travel to the process surface. Energetic electrons cross magnetic fields by means of collision events, which cause energy loss.

In FIG. 2, a side view illustrates the arrangement magnets 11 used in the commercial product. The two magnets nearest the arc chamber have the opposite polarity facing the source magnet. This links magnetic flux to the source magnetic field and increases electron emission current. The remaining guide tube magnets serve to distribute emission electrons around the beam cross section, while minimizing the magnetic flux across the beam, 2. This is the commercial high density plasma flood system. Since invention of the HD PFS, beams with a thin, highly elongated shape, called ribbon beams, have become commercially popular.

BRIEF SUMMARY OF THE INVENTION

It is an object of the invention to provide a cold plasma magnetic flood system that reduces the magnetic flux across the beam region without using a fully linked set of guide tube magnets used in the HD PFS. Although suitable for other systems, this provides for a magnet flood system that is suitable for ion ribbon beam processing.

With the foregoing and other objects in view there is provided, in accordance with the invention, an ion beam processing system, comprising: an ion beam generator; a plasma flood device disposed to flood charged particles into the ion beam, the plasma flood device including a plasma generator with a plasma opening issuing into the ion beam region; a magnet system having a first magnet configured to establish a first magnetic field for plasma generation and at least one second magnet disposed opposite the plasma opening across the ion beam and configured to establish a second magnetic field to offset the first magnetic field and generate substantially a null field in the region of the ion beam.

In accordance with an additional feature of the invention, the first magnet of the system is a source magnet disposed in an arc chamber of the plasma flood device. A source magnetic yoke may be used to enhance and/or shape the magnetic field inside the arc chamber. It will be understood by those of skill in the pertinent art that the yoke and chamber may or may not be separate. Typically a separate chamber is used to provide thermal isolation for the yoke, and also to reduce metal contamination.

In accordance with a concomitant feature of the invention, at least one additional magnet is provided as a plurality of permanent magnets disposed on the opposite side of the beam so as to generate a magnetic null field substantially corresponding to the cross section of the ion beam.

In the HD PFS, the source magnetic yoke serves to enhance the magnetic field strength available at the cathode. The guide tube magnets serve multiple purposes: First, they provide the magnetic linkage to the monocusp source magnetic field in order to increase net charged particle current (also called emission current) through the aperture into the guide tube. Second, they distribute flood electrons around the guide tube. Third, they create a low magnetic field region (also called a magnetic null) in the beam transport region in the center of the guide tube. In the case of an arc powered plasma, the heating current of the cathode filament also contributes a magnetic field. However, the filament can be designed so that the dipole field of the heater current does not extend into the beam region.

The purpose of the magnetic null is to minimize perturbation of the ion beam by the flood magnetic fields. The presence of significant flood magnetic field across the beam transport region could be deleterious to beam uniformity, caused by the fundamental v×B forces when charged particles cross a magnetic field. Since specified process uniformity is typically required for tool acceptance, the flood should not cause "significant" beam non-uniformity. In this context, the concept "significant" is process-defined and it is customer-defined, and it constantly evolves. For example, dose non-uniformity less than 2% may be required by some customers today, 1.5% by others for specific processes. Tool diagnostics and control systems can compensate somewhat for beam non-uniformity, for example, in some systems 2% dose uniformity may be achievable with 5% beam density non-uniformity. However, the pressure to achieve process specification beam is so great that a non-perturbing flood design is preferred.

Since the development of the HD PFS, as described above, ribbon beams have become popular. A ribbon beam, as opposed to a spot beam, is elongated in one dimension, and is relatively thin in the other dimension, hence the term ribbon. By way of example, the beam may have a nominal cross sectional width of, e.g., 3 cm and a length of, e.g., 20 cm.

According to the present invention, a magnetic plasma source in communication with an ion beam includes a magnetic design that produces a null in the transverse magnetic field in the region of the ion beam, in order to reduce perturbation of the ion beam by the flood magnetic flux. The invention incorporates a minimum of two magnets. The source magnetic field serves to enhance desired arc performance characteristics, such as, power efficiency, gas efficiency, or service life, and may include a magnetic filter effect for charging control. At least one additional magnet is incorporated specifically to reduce the total magnetic flux transverse to the process ion beam.

Other features which are considered as characteristic for the invention are set forth in the appended claims.

Although the invention is illustrated and described herein as embodied in a magnetic field reduction apparatus and magnetic plasma flood system for ion beam processing, it is nevertheless not intended to be limited to the details shown, since various modifications and structural changes may be made therein without departing from the spirit of the invention and within the scope and range of equivalents of the claims.

The construction and operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 3C adds a diagrammatic outline of an ion beam traversing the magnetic field, according to the prior art;

FIGS. 4A, 4B, 4C illustrates a further embodiment of the magnetic flood system adapted to a ion beam with a ribbon geometry, according to the prior art;

FIG. 8 is a diagram illustrating an exemplary embodiment of the invention with two ion beams and two oppositely disposed flood systems.

DETAILED DESCRIPTION OF THE INVENTION

Figure 1:
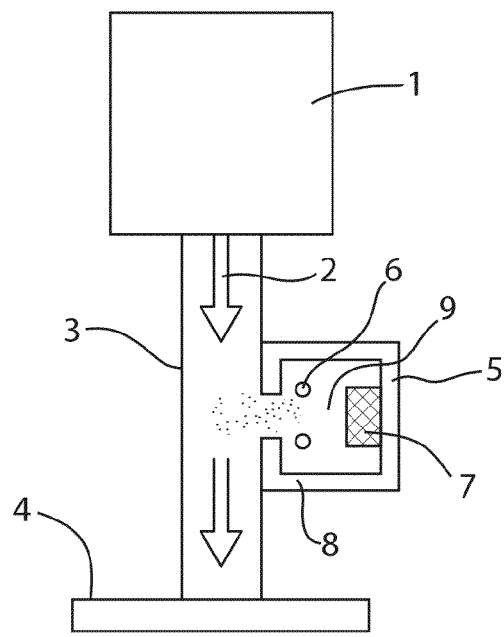
FIG. 1 is a highly diagrammatic side top view of a high density plasma flood system for an ion beam system according to the prior art.
Figure 2:
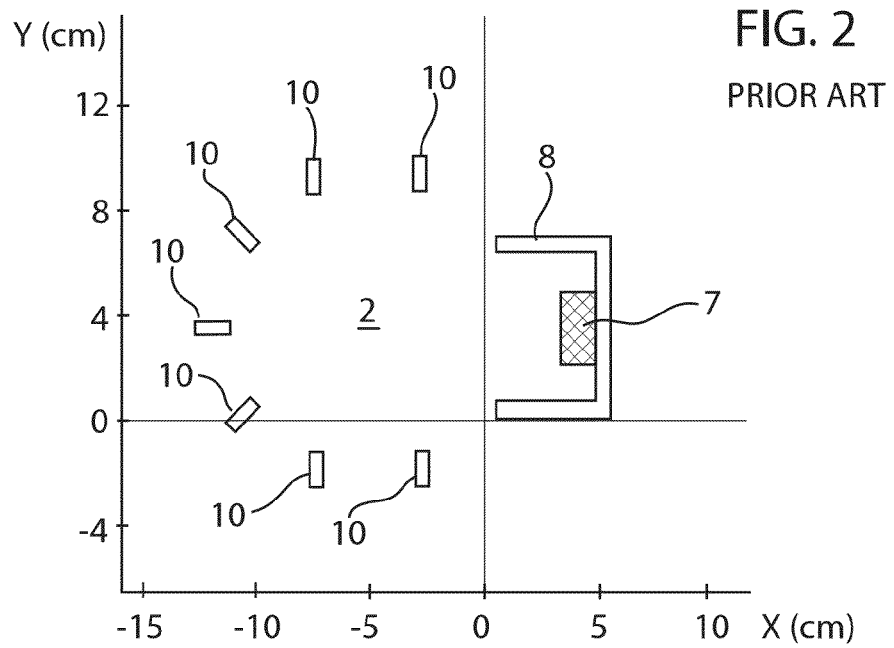
FIG. 2 is a diagrammatic side view section of a high density plasma flood system taken through a beamline and magnetic flood system according to the prior art.

Referring now to the figures of the drawing in detail and first, particularly, to FIGS. 1 and 2 thereof, there are shown the primarily important elements of the HD PFS. They include a source magnet 7, a source magnetic yoke 8, an arc chamber 9, a filament cathode 6, a gas feed, and a guide tube 3. The ion beam direction is orthogonal to the plane of the drawing in FIG. 2. The beam 2 of the prior art system is a spot beam. Here, the invention deals with ribbon beams. Generally also, ribbon beam systems implant single wafers 4. However, multiple wafer systems may be provided.

More specifically, FIG. 1 illustrates a high density plasma flood system for an ion beam system according to the prior art. The system includes an ion beam generator 1, an ion beam 2, a beamline 3 (optionally with walls), a process target 4, an arc chamber 5, a cathode filament 6, a source magnet 7, a magnet yoke 8, and an arc volume 9.

It will be understood that the arc chamber 5 and the magnet yoke 8 are often physically different, in order to isolate the yoke from arc heat and isolate the plasma from yoke metal.

The diagrammatic side view section in FIG. 2 of a high density plasma flood system is taken through a beamline and magnetic flood system according to the prior art. In this case, the beam 2 is surrounded by a wall 3, called a 'guide tube' (which is not a functionally descriptive name) that serves to mount a set of linked magnets 10. The beam direction in FIG. 2 would be into or out of the drawing plane. In the present commercial product, the guide tube magnets are equal size guide tube magnets are equal size and magnetically linked. The two magnets nearest the arc chamber have the opposite polarity facing the source magnet. This links magnetic flux to the source magnetic field and increases electron emission current. The remaining guide tube magnets serve to distribute emission electrons around the beam cross section, while minimizing the magnetic flux across the beam 2.

The magnetic system includes the source magnet 7 and guide tube magnets 9, as well as a source magnetic yoke 8. The cold plasma magnetic filter effect described in U.S. Pat. No. 5,545,257 is achieved by design of the source magnet and the primary electrons power source, in this case, a cathode filament. My earlier U.S. Pat. No. 5,545,257 describes additional detail and it is herewith incorporated by reference in its entirety.

FIG. 2 illustrates a basic diagram of the distribution of a source magnet 7, a source magnetic yoke 8, and a number of strategically placed guide tube magnets 10. The beam direction in FIG. 2 would be into or out of the drawing plane. The indicated scale shows that the guide tube used in the context would have an approximate diameter of 10 cm.

As indicated by the scales of the drawings, the HD PFS is approximately 10 to 20 cm across. For flood effectiveness, performance is tracked by emission current. However, for this application, magnetic perturbation scales proportional to the total Gauss-cm of the transverse field through which the beam crosses. Accordingly, the field strength in the beam region and depth of the field both count. Further, the distance from the wafer affects the emission current required for charging control, but otherwise differs significantly among tools. Generally it is best to have the flood proximate to the wafer, but the actual location is usually dictated by the specific beamline architecture.

Figure 3A:
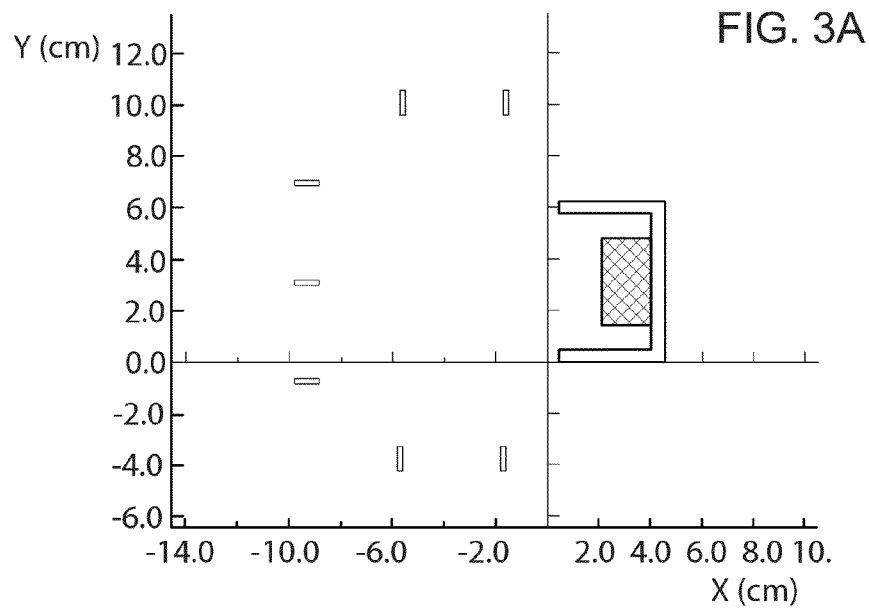
FIG. 3A is a diagrammatic side view section of a high density plasma flood system that illustrates the magnets and yoke according to the prior art.
Figure 3B:
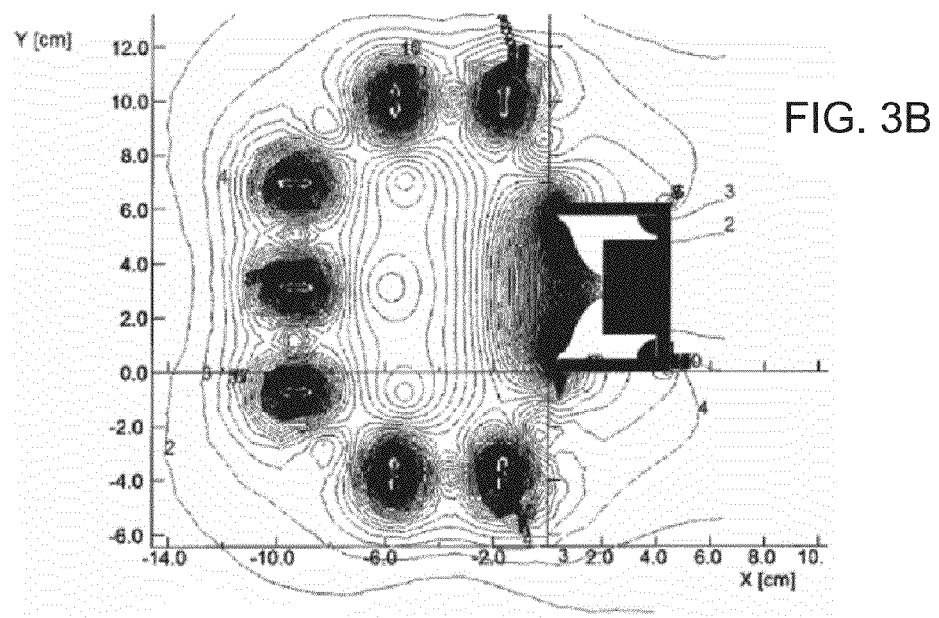
FIG. 3B illustrates contours of strength of the transverse components of the magnetic field of the assembly of FIG. 3A.

FIGS. 3A, 3B, and 3C illustrate a direct adaptation of the HD PFS magnet system to a ribbon ion beam. There, the adaptation is characterized in that guide tube magnets are added to preserve the magnetic linkage for a wide, but thin beam. The beam 2 is indicated as an ellipse. It will be understood that the boundary of the beam is not as sharp as it is indicated, but it is only an approximation. It is seen that the magnet distribution causes a magnetic null field in the center that approximates the shape of the beam.

Figure 4B:
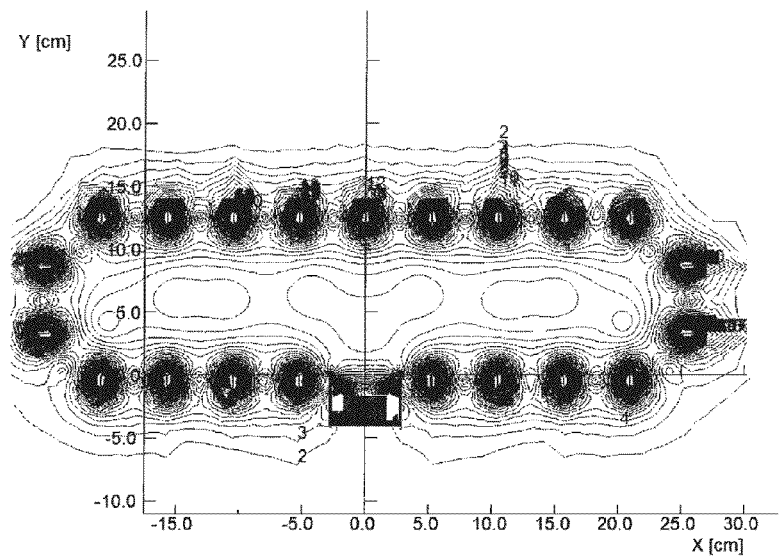
Figure 4C:
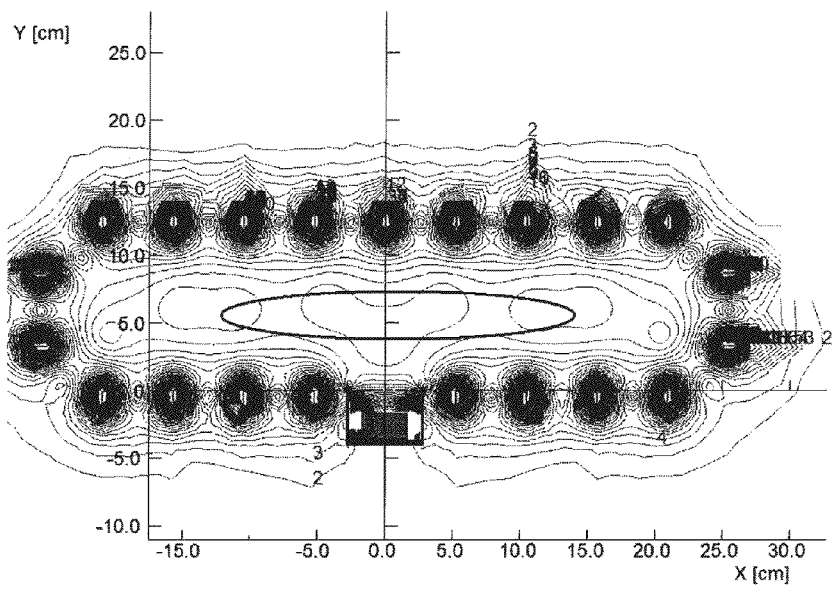

FIGS. 4A, 4B, and 4C show a ribbon beam flood with additional, strategically distributed guide tube magnets. The resultant magnetic field is indicated in FIG. 4B and the approximate region of the ion beam 2 is indicated in FIG. 4C.

The linked HD PFS magnetic geometry in FIGS. 3A, 3B, 3C and also FIGS. 4A, 4B, 4C may not be practical in a long ribbon beam.

Figure 5:
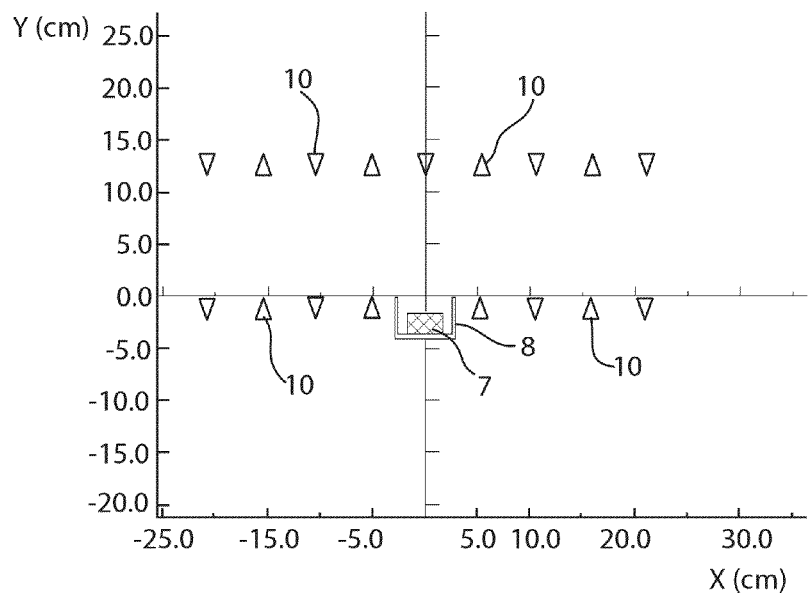
FIG. 5 is a diagram illustrating a modification of the ribbon beam flood system according to the invention, which eliminates some of the linking guide tube magnets.

FIG. 5 shows a ribbon beam flood designed to minimize the transverse magnetic flux in the beam region, without the magnetic linkage of the HD PFS configuration. That is, the HD PFS magnetic design of FIG. 5 is adapted to a long ribbon beam by removing the end magnets that link the top and bottom. This configuration minimizes the transverse magnetic field, but maintains flux linkage to the source magnetic field to help ensure emission electron distribution. The polarity arrangement of the magnets is indicated by the directional placement of the guide tube magnets 10.

Figure 6:
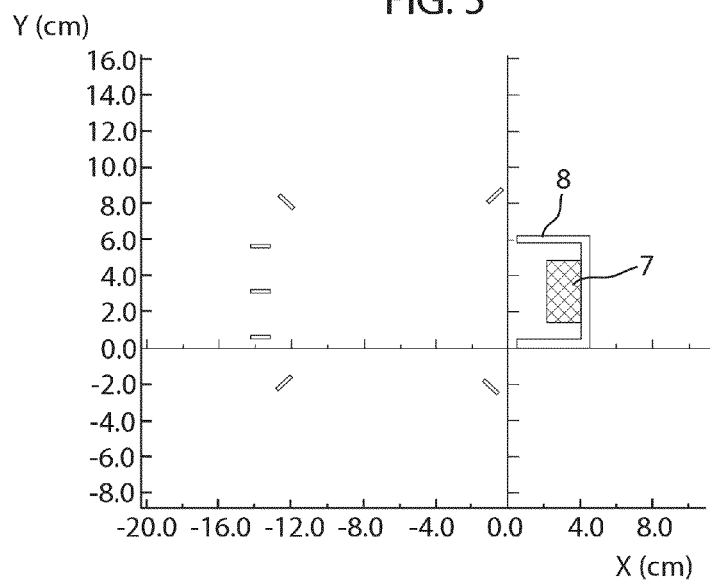
FIG. 6 is a similar diagram illustrating a further exemplary embodiment of the placement of guide tube magnets for the magnetic flood system, according to the invention.

Quality cancellation of the source magnetic field can be achieved with only a few magnets, as illustrated, by way of example, in FIG. 6. There, two guide tube magnets near the source are used to enhance emission current and five magnets opposite the source are used to null the net source field in the beam region. Because it has no significant extended field in the beam region, this configuration can be used with a ribbon beam.

Figure 7A:
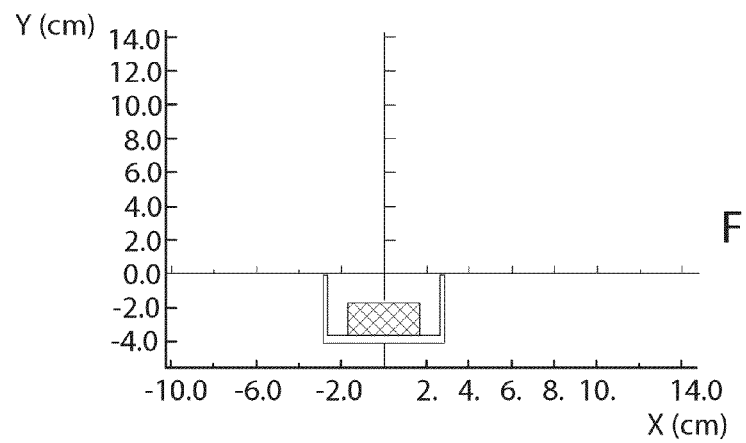
FIGS. 7A, 7B, 7C illustrate a simplified system with a single source magnet and a single guide tube magnet, according to the invention.
Figure 7B:
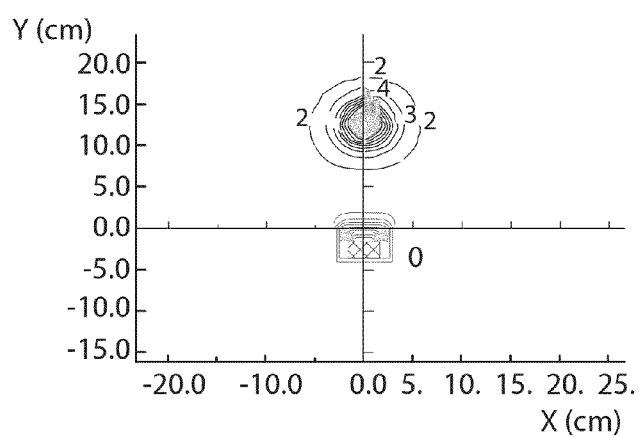
Figure 7C:
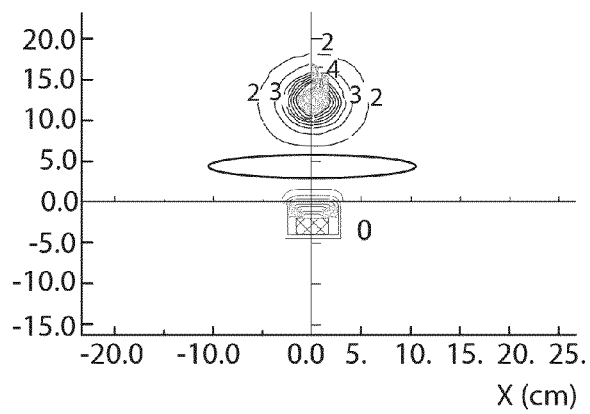

One of the primary goals is a simplification of the system by reducing the number of magnets used to create the null field, preferably reducing the number to one. Such a modification is shown in FIGS. 7A, 7B, 7C, where the separate guide tube structure is eliminated and a single null magnet 9 is mounted on the beamline opposite the monocusp source magnet. In other words, the minimum number of magnets needed to create a low transverse magnetic field in the beam region is one. The configuration of FIG. 7 thus shows a single magnet 7 opposite the ion source to null the net source field and create a weak transverse magnetic field in the beam region. Because it has no extended magnetic field in the beam region, this configuration is compatible with ribbon ion beam geometry. The source magnet yoke serves to enhance the magnetic field strength in the cathode region and affects the location of the null field in the beam region.

A source magnetic yoke is not necessarily required to create a low transverse magnetic field region for the beam. The only essential magnetic elements according to the invention are the source magnet 7 and the oppositely placed null magnet 10.

The above configurations use a single plasma flood source and a variety of strategies in placing guide tube magnets to assist the spatial distribution of emission electrons in a ribbon beam. The minimal magnetic configuration uses only a single null magnet and relies on net beam plasma space charge confinement to ensure flood electron distribution. However, multiple plasma flood sources may be preferred to produce adequate emission current for a large ribbon beam. Further, it is possible to combine two or more plasma floods with two or more ribbon beams.

A two-source, two-beam system is illustrated in FIG. 8. Here, there are provided two beams 2 that propagate in parallel with one another. The beams 2 are separated by a liner 11. The two flood sources are disposed facing one another and facing towards the two beams 2. The magnets 7 of the plasma floods are opposed by a null magnet that is integrated in the liner 11.

Figure 9:
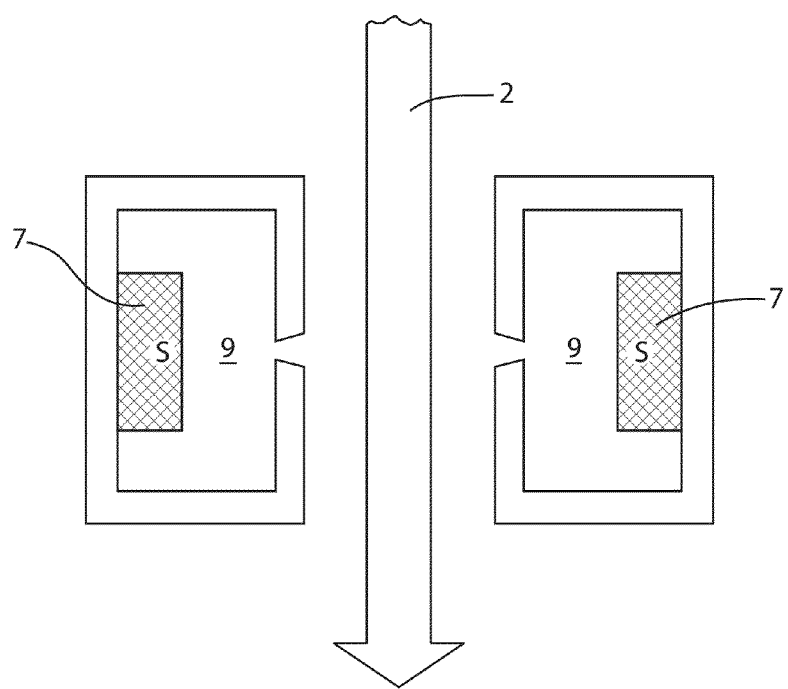
FIG. 9 is a similar diagram illustrating an exemplary embodiment of the invention with a single ion beam and two oppositely disposed plasma floods.

A two-flood, single beam system according to the invention is illustrated in FIG. 9. It is quite similar to the illustration of FIG. 8, except that the liner 11 with the magnet 10 is eliminated and the beams 2 are now a single beam region 2.

The optimum magnetic null, in that case, is achieved by mounting the floods, i.e., the magnets 7 (with or without a yoke 8) opposite each other. No guide tube magnets are required, as the null field is defined by the two magnets 7. The system must be carefully designed because it may not produce a highly uniform distribution of flood electrons. Yet a further modification, with an advantageous flood distribution, is produced by mounting multiple flood sources side by side, with null guide tube magnets mounted opposite each source.

The above text makes reference to several published articles. These are listed here for the reader's convenience:

Ito, Hiro, et al.; "High Density Plasma Flood System for Wafer Charge Neutralization", 1998 International Conference on Ion Implantation Technology Proceedings, Kyoto, Japan, NJ-IEEE 1999, pp. 478-481.

Wan, Z., Chen, L., and Chen, J., "Water Cooled Flood Source for Intense Ion Beam Implantation" in Proc. 14th Int. Conf. on Ion Implantation Tech., Taos, N.M., U.S.A., edited by B. Brown et al., pp 432-435.

The invention claimed is:

1. An ion beam processing system, comprising:
   an ion beam generator and a processing target;
   a plasma flood device disposed to flood charged particles into the ion beam region, said plasma flood device including a plasma generator with an aperture issuing into said ion beam region;
   a magnet system having a first magnet configured to establish a first magnetic field effective in the cathode region of the plasma generator and at least one second magnet disposed opposite said source magnet, across the ion beam, and configured to establish a second magnetic field effective to offset said first magnetic field and generate substantially a null field in the region of the ion beam.

2. The ion beam processing system according to claim 1, wherein said ion beamline has a substantially rectangular cross section for guiding a ribbon beam with a relatively narrow extent in one direction and a relatively wide extent in a direction perpendicular to the one direction.

3. The ion beam processing system according to claim 1, wherein said plasma generator is a d.c. flood generator powered by a d.c. electrical arc.

4. The ion beam processing system according to claim 3, wherein said plasma generator includes a filament cathode powered by d.c. power or by a.c. power.

5. The ion beam processing system according to claim 1, wherein said first magnet of said magnet system is a source magnet disposed in an arc chamber of said plasma flood device, and said arc chamber is configured to form a source magnetic yoke.

6. The ion beam processing system according to claim 1, wherein said at least one second magnet is one of a plurality of permanent magnets disposed at said ion beam guide so as to generate an elongated magnetic null field substantially corresponding to a cross section of the ion beam with a ribbon geometry.

7. The ion beam processing system according to claim 3, wherein said plasma generator is powered by radio frequency (RF) power, wherein the cathode is replaced by an RF coupler and power supply disposed internally or externally to said arc chamber.

8. The ion beam processing system according to claim 3, wherein said plasma generator is powered by microwave power, wherein the cathode is replaced by a microwave coupler and power supply.

9. The ion beam processing system according to claim 1, wherein said magnet system consists of said first magnet configured to establish a first magnetic field effective in the cathode region of the plasma generator and a single second magnet disposed to generate substantially a null field in the region of the ion beam.

* * * * *